United States Patent
Shen et al.

(10) Patent No.: US 11,488,931 B2
(45) Date of Patent: Nov. 1, 2022

(54) ENCAPSULATED FAN-IN SEMICONDUCTOR PACKAGE WITH HEAT SPREADER AND METHOD OF MANUFACTURING THE SAME

(71) Applicant: CHENGDU ESWIN SIP TECHNOLOGY CO., LTD., Chengdu (CN)

(72) Inventors: Minghao Shen, San Jose, CA (US); Xiaotian Zhou, San Jose, CA (US)

(73) Assignee: CHENGDU ESWIN SIP TECHNOLOGY CO., LTD., Chengdu (CN)

(*) Notice: Subject to any disclaimer, the term of this patent is extended or adjusted under 35 U.S.C. 154(b) by 18 days.

(21) Appl. No.: 16/971,412

(22) PCT Filed: Feb. 25, 2019

(86) PCT No.: PCT/IB2019/000312
§ 371 (c)(1),
(2) Date: Aug. 20, 2020

(87) PCT Pub. No.: WO2020/170002
PCT Pub. Date: Aug. 27, 2020

(65) Prior Publication Data
US 2021/0242169 A1 Aug. 5, 2021

Related U.S. Application Data

(60) Provisional application No. 62/634,579, filed on Feb. 23, 2018.

(51) Int. Cl.
*H01L 21/56* (2006.01)
*H01L 21/78* (2006.01)
*H01L 23/00* (2006.01)

(52) U.S. Cl.
CPC ............ *H01L 24/94* (2013.01); *H01L 21/561* (2013.01); *H01L 21/568* (2013.01); *H01L 21/78* (2013.01)

(58) Field of Classification Search
None
See application file for complete search history.

(56) References Cited

U.S. PATENT DOCUMENTS

2006/0081966 A1 4/2006 Farnworth et al.
2013/0037917 A1* 2/2013 Xue ...................... H01L 23/492
257/E23.033

(Continued)

FOREIGN PATENT DOCUMENTS

CN 105140191 A 12/2015
CN 107134440 A 9/2017

OTHER PUBLICATIONS

International Search Report dated Nov. 27, 2019 received in International Application No. PCT/IB2019/000312.

*Primary Examiner* — Jay C Chang
(74) *Attorney, Agent, or Firm* — Scully, Scott, Murphy & Presser, P.C.

(57) ABSTRACT

Disclosed is a method of manufacturing a semiconductor device that includes securing a lower surface of a wafer to a supporting surface of a carrier substrate formed of copper or other metal having good thermal conductance. Further semiconductor processing for packaging can include forming an RDL on the wafer, etching scribe channels through the wafer, and coating the wafer with encapsulant. After dicing, the metal carrier remains in contact with and supporting the lower surface of the wafer, and the remainder of the wafer remains coated by the encapsulant.

17 Claims, 3 Drawing Sheets

(56) References Cited

U.S. PATENT DOCUMENTS

2013/0037935 A1\* 2/2013 Xue .................... H01L 23/3114
 257/737
2013/0127043 A1 5/2013 Poddar et al.
2018/0047688 A1 2/2018 Ho et al.

\* cited by examiner

ENCAPSULATED FAN-IN SEMICONDUCTOR PACKAGE WITH HEAT SPREADER AND METHOD OF MANUFACTURING THE SAME

CROSS-REFERENCE TO RELATED APPLICATIONS

The present application is a national phase application of PCT International Application No. PCT/IB2019/000312, filed on Feb. 25, 2019, which claims the priority of U.S. Provisional Patent Application No. 62/634,579, filed on Feb. 23, 2018, the entire contents of each of which are herein incorporated by reference for all purposes. No new matter has been introduced.

FIELD OF THE INVENTION

The present disclosure relates to semiconductor packaging technologies, more particularly and more particularly to semiconductor devices having packages including thermal dissipation structures and pressure venting capability.

BACKGROUND

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the conductor material to manipulate and control the conductivity of the semiconductor device.

Heat dissipation in integrated circuits has continued to gain an increasing interest in recent years due to the miniaturization of semiconductor devices. The temperature increase becomes relevant for cases of relatively small-cross-sections wires, because such temperature increase may affect the normal behavior of semiconductor devices.

As integrated circuit technology continues to evolve, manufacturing processes continue to improve to allow for increases in density and operating frequency of ICs. These improvements are driven by a steady demand for high speed data processing. However, these advances have also resulted in ICs that produce increased heat generation per unit time per unit volume has increased significantly. Semiconductor packages are typically subject to temperature cycling during normal operation.

Therefore, just how to provide the semiconductor package with even more effective heat-dissipating path has become an important issue in order to improve the performance and maintain the reliability of the semiconductor devices.

In semiconductor device assembly, some semiconductor chips (also referred to as an integrated circuit (IC) chip or "die") have reached a density level that can make it difficult for making connections to and from the chip. Therefore, many such devices include a redistribution layer (RDL) and with ball-shaped beads or bumps of solder for forming electrical connections to and from the chip and conductive traces on a packaging substrate. Semiconductor chips of this type are commonly called "flip chips."

FIGS. 1A through 1E show schematic, cross-sectional diagrams of a typical method for fabricating a wafer level package having a redistribution layer (RDL).

As shown in FIG. 1A, a front-end-of-line (FEOL) wafer 100 is shown. The FEOL wafer 100 has undergone the first portion of integrated circuit (IC) fabrication where individual devices are patterned in the semiconductor material of the wafer. Thus, the wafer 100 may include a plurality of semiconductor device structures (not shown) formed according to known processes. Next, as shown in FIG. 1B, the wafer 100 has undergone at least a portion of back-end-of-line (BEOL) processes, including formation of the RDL layer 102 and etching of scribe-channels ("streets") 104. The RDL layer 102 re-routes the I/O layout into a looser pitch footprint. Such redistribution typically includes thin film polymers such as BCB, PI or other organic polymers and metallization such as Al or Cu to reroute the peripheral pads to an area array configuration. Layer 102 represents dielectric and metal layers formed to allow for electrical communication from the wafer 100 to solder bumps or solder balls 108 shown in FIGS. 1C-1E. The scribe channels 104 define cut lines for dividing the wafer 100 into individual devices or dies. As shown in FIG. 1C, solder balls 108 are formed on the RDL for further connection and the wafer 100 is covered with an encapsulation layer 110. Next, at FIG. 1D, back etching processes are used to remove a bottom portion 112 of the wafer 100. Then, at FIG. 1E, the exposed wafer 100 is covered by an additional portion of the encapsulation layer 110 and the wafer 100 is diced into individual dies. Finally, at FIG. 1F, an integrated heat spreader (IHS) 114 is attached to the back side of each device by thermal interface material (TIM 1) in order to provide for heat conductance away from the die.

While the IHS does provide some amount of improved thermal dissipation, there remain shortcomings to methods and apparatus such as those shown in FIGS. 1A-1F. For example, heat dissipation is hampered by the presence of the encapsulation layer 119 between the devices and the IHS 114. Also, the final device exhibits relatively poor mechanical strength due to the thinning of the Si die and low modulus of mold compound, which in turn limits the overall potential package size. This also means that this is an inefficient use of IHS due to the high thermal impedance of the TIM. It would also be desirable to eliminate process steps and materials where possible without sacrificing the quality of the final device.

The present disclosure provides novel improved packaging methods resulting in reduced warpage or other defects.

BRIEF SUMMARY

Methods of manufacturing a semiconductor device according to the present disclosure can include providing a wafer having a plurality of integrated circuits, securing a lower surface of the wafer to a supporting surface of a carrier substrate, forming a redistribution layer (RDL) on an upper surface of the wafer, the upper surface of the wafer being opposite the lower surface of the wafer, etching scribe channels through the and at least a portion of the wafer towards the carrier substrate in the wafer from the RDL to the carrier substrate, encapsulating the wafer and RDL within an encapsulant, including providing a portion of the encapsulant in the scribe channels, and dicing the wafer and carrier substrate along the scribe channels without exposing the wafer such that the wafer remains covered on a first portion thereof by the carrier substrate and a remaining portion thereof by the encapsulant.

In some embodiments, the plurality of integrated circuits includes at least identical integrated circuits.

In some embodiments, the securing of the lower surface of the wafer to the supporting surface of the carrier substrate includes forming a bonding surface on at least one of the carrier substrate and the wafer. In some such embodiments, the forming of the bonding surface includes planarizing to achieve a bonding surface having a roughness of less than or equal to 20 Angstroms.

In some embodiments, the securing of the lower surface of the wafer to the supporting surface of the carrier substrate includes coating the supporting surface of the carrier substrate with a corrosion inhibitor. In some such embodiments, the securing of the lower surface of the wafer to the supporting surface of the carrier substrate further includes bonding lower surface of the wafer to the supporting surface of the carrier substrate by proximity contact. In some embodiments, the proximity contact is made with a bonding force that is less than or equal to 100 g/mm$^2$.

In some embodiments, the securing of the lower surface of the wafer to the supporting surface of the carrier substrate includes coating at least one of the lower surface and the supporting surface with a metal layer. In some such embodiments, the metal layer includes at least one of titanium, tantalum, and copper. In some embodiments, the metal layer is less than or equal to 1 nm in thickness.

In some embodiments, the securing of the lower surface of the wafer to the supporting surface of the carrier substrate further includes bonding lower surface of the wafer to the supporting surface of the carrier substrate by proximity contact. In some such embodiments, the proximity contact is made with a bonding force that is less than or equal to 100 g/mm$^2$.

In some embodiments, the securing of the lower surface of the wafer to the supporting surface of the carrier substrate includes a self-annealing process resulting bonding between the lower surface of the wafer and the supporting surface of the carrier substrate. In some such embodiments, the self-annealing process results in ionic bonding between the lower surface of the wafer and the supporting surface of the carrier substrate. In some such embodiments, the self-annealing process is performed at a temperature in a range of 15 C to 27 C.

In some embodiments, the securing of the lower surface of the wafer to the supporting surface of the carrier substrate includes an annealing process performed at a designated temperature. In some such embodiments, wherein the self-annealing process is performed at a designated in a range of 15 C to 250 C.

In some embodiments, the first portion of the wafer that remains covered by the carrier substrate is the lower surface of the waver.

In some embodiments, the remaining portion of the wafer that remains covered by the carrier substrate includes the upper surface and side surfaces of the wafer.

According to other aspects of this disclosure, an integrated circuit package is disclosed that comprises a semiconductor wafer having an integrated circuit formed therein, an RDL formed on an upper surface of the wafer, a carrier substrate having a metal upper surface bonded to a lower surface of the semiconductor wafer by ionic bonding, and an encapsulant coating at least a portion of the sides and upper surface of the wafer.

DETAILED DESCRIPTION

Figure 1A:
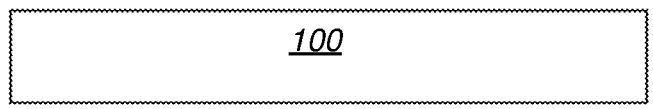
FIGS. 1A-1F show schematic, cross-sectional diagram of a traditional method for fabricating a wafer level package.
Figure 1B:
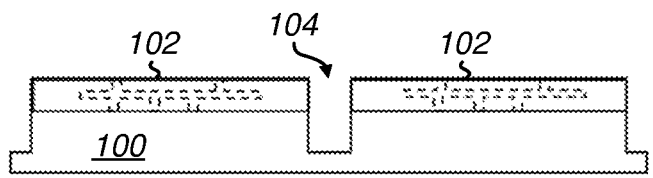
Figure 1C:
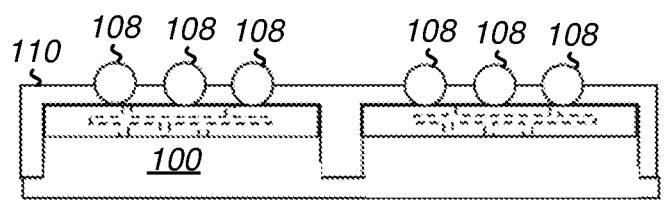
Figure 1D:
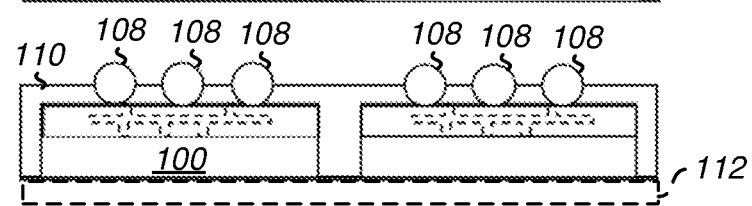
Figure 1E:
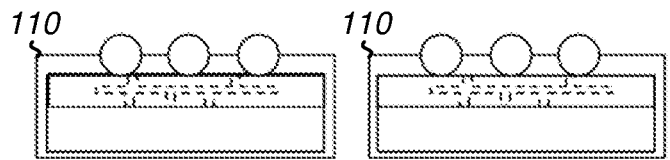
Figure 1F:
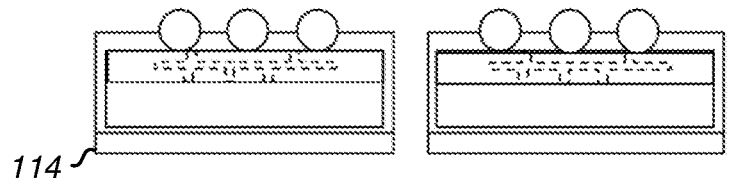

This disclosure relates to a wafer level packaging process that results in a carrier substrate that serves as a heat-dissipating plate adjoining or bonded to the wafer backside. The carrier substrate is preferably formed of copper or other metal having good thermal conductivity. The earner substrate serves a dual role by acting as both a heat spreader and as a mechanical support. This advantageously provides for both improved heat dissipation with an integrated heat spreader and improved mechanical reliability.

As a mechanical support, the Young's modulus for copper is several times higher than that of an encapsulant or mold compound. Also, the direct bonding between the wafer and the copper carrier substrate provides stronger adhesion strength between copper and silicon, than between molding or encapsulant and silicon. This added strength reduces warpage, and thus allows for better reliability. This improved interface reduces the possibility of delamination and interface cracking, provides stronger mechanical strength of copper to provide better shock ho protection. Given all of this, it will be understood that these advantages also allow for Given above, FI package can allow large package size to accommodate more applications.

In the following detailed description of the invention, reference is made to the accompanying drawings, which form a part hereof, and in which is shown, by way of illustration, specific embodiments in which the may be practiced. These embodiments are described in sufficient detail to enable those skilled in the art to practice the invention. Other embodiments may be utilized, and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

FIGS. 2A-2E show schematic, cross-sectional diagrams showing an exemplary method for fabricating a wafer level package according to the present disclosure.

Figure 2A:
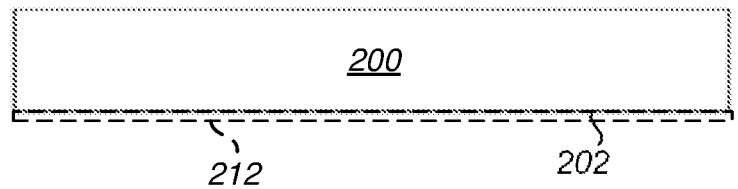
FIGS. 2A-2E show schematic, cross-sectional diagrams of an exemplary method for fabricating a wafer level package according to embodiments of the present disclosure.
Figure 2B:
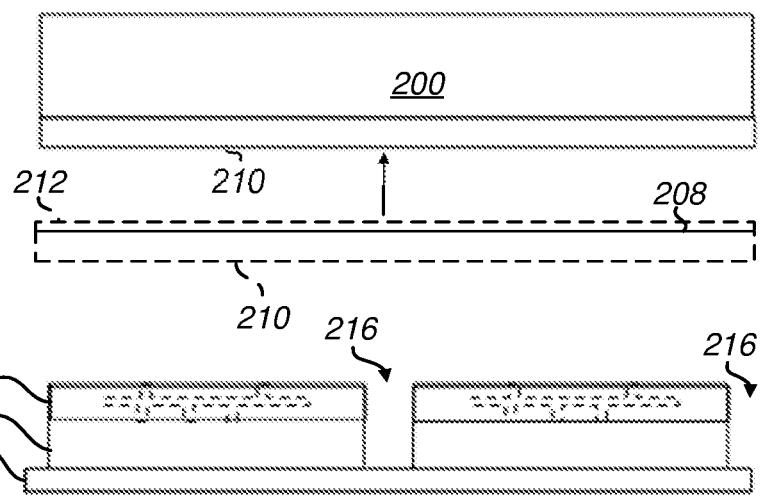

Turning first to FIGS. 2A and 2B, a FEOL wafer 200 and a carrier substrate 210 are prepared for assembly.

As shown in FIG. 2A, the front-end-of-line (FEOL) wafer 200 has undergone the first portion of integrated circuit (IC) fabrication where individual devices are patterned in the semiconductor material of the wafer. Thus, the wafer 200 may include a plurality of identical integrated circuits (not shown) formed according to known processes that can be diced into respective electronic devices.

As shown in FIG. 2A, the carrier substrate 210 can be a metal substrate, for example formed of copper or other desired metal material. The carrier substrate 210 can alternately be a glass, ceramic, sapphire or quartz substrate.

Further, a bonding surface is formed on the bottom surface of the wafer 200 and on the upper surface of the carrier substrate 210. More specifically, a wafer bonding surface 202 is formed on the wafer 200 and a carrier bonding surface 208 is formed on the carrier substrate 210. Formation of the wafer bonding surface 202 and the carrier bonding surface 208 can include planarizing the surfaces, for example by chemical mechanical polishing (CMP) or the like. In some embodiments, the planarizing of the wafer bonding surface 202 and the carrier bonding surface 208 results in a surface average roughness Ra of less than or equal to 20 Angstroms (Å), or more preferably less than or equal to 15 Angstroms (Å), or even more preferably less than or equal to 10 Angstroms (Å).

In some embodiments, the polished carrier bonding surface 208 can be passivated by coating the carrier bonding surface 208 with a thin layer of a corrosion inhibitor to prevent oxidation. For example, for embodiments where the bonding surface 208 is copper, a corrosion inhibitor can include azole compounds, diols, and carboxylic acids. These compounds are soluble in aqueous solutions and inhibit corrosion by forming passive films. Once the corrosion is prevented, the compounds must be easily removed from the Cu surface and leave little or no post-clean organic residue.

In some such embodiments, the smooth wafer and carrier bonding surfaces can then be bonded together by proximity contact with bonding force in a range of 0 g/mm$^2$ to 100 g/mm$^2$, thereby bonding the carrier substrate 210 to the wafer 200. Copper surfaces, particularly when formed as a film, can undergo a "self-annealing" process resulting in ionic bonding with an adjoining surface, even at room temperature, in a range of 15 C to 27 C. However, the self-annealing process can sometimes yield non-uniformities due to there being little or over the recrystallation process. Therefore, it can be desirable to have the annealing occur at an elevated temperature. In some embodiments, the annealing is done at a designated temperature in a range of 15 C to 250 C, or more preferably in a range of 100 C to 220 C, or even more preferably in a range of 150 C to 2000. Annealing at an elevated temperature in the foregoing ranges can provide progressively higher bonding toughness (J/m$^2$).

Alternatively, in some embodiments a thin layer 212 of metal for example titanium, tantalum, or copper is sputtered on the wafer bonding surface 202 and on the carrier bonding surface 208. The layers 212 are preferably less than or equal to 1 nm in thickness. In some such embodiments, the smooth wafer and carrier bonding surfaces can then be bonded together by proximity contact with bonding force in a range of 0 g/mm$^2$ to 1.00 g/mm$^2$, thereby bonding the carrier substrate 210 to the wafer 200. As discussed above, copper surfaces can undergo a "self-annealing" process resulting in ionic bonding with an adjoining surface, but the annealing process at an elevated temperature can yield improved bonding results. Thus, in some embodiments, the annealing is done at a temperature in a range of 15 C to 250 C, or more preferably in a range of 100 C to 220 C, or even more preferably in a range of 150 C to 200 C. Annealing at an elevated temperature in the foregoing ranges can provide progressively higher bonding toughness (J/m$^2$).

Figure 2C:
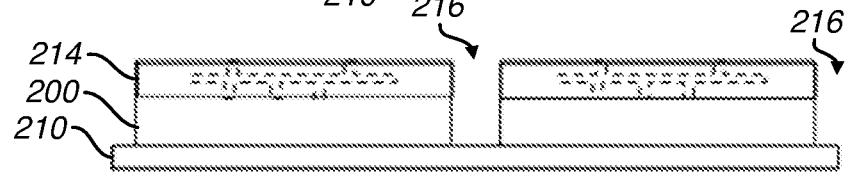

Next, as shown in FIG. 2C, the wafer 200 has undergone at least a portion of back-end-of line (BEOL) processes, including formation of the RDL layer 214 and etching of scribe-channels ("streets") 216. The RDL layer 214 reroutes the I/O layout into a looser pitch footprint Such redistribution typically includes thin film polymers such as BCB, PI or her organic polymers and metallization such as Al or Cu to reroute the peripheral pads to an area array configuration. Layer 214 represents dielectric and metal layers formed to allow for electrical communication from the wafer 200 to solder bumps or solder balls 218 shown in FIGS. 2D-2E. The scribe channels 216 define cut lines for dividing the wafer 200 into individual devices or dies. Here, the scribe channels 216 are etched from above the wafer 200, completely through the RDL, and through some or all of the wafer 200 such that the scribe channels 216 are at least partially defined by exposed sidewalls of the wafer 200. Note, however, that the carrier substrate 210 is not etched at this point in the process. Instead, the carrier substrate 210 remains intact so as to provide additional support for the processes performed hereafter until the final dicing of the wafer 200.

Figure 2D:
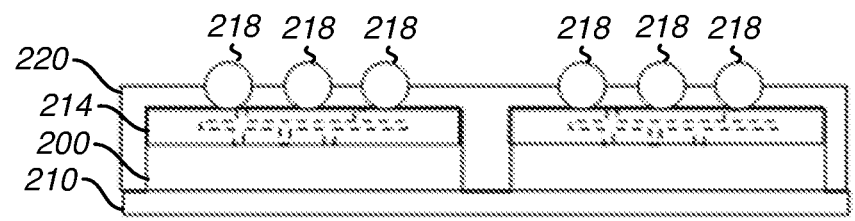

As shown in FIG. 2D, solder balls 218 are formed on the RDL 214 for further connection and the wafer 200 is covered with an encapsulation layer 220. Notably, the formation of the encapsulation layer 220 includes depositing at least a portion of the encapsulant in the scribe channels 216.

Figure 2E:
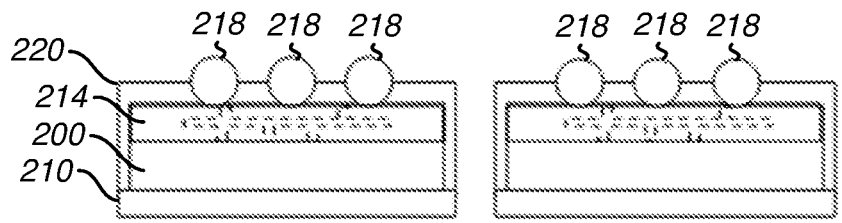

Finally, at FIG. 2E, the wafer 200 is diced into individual dies. Notably, the wafer is diced along the scribe channels 216 and through the carrier substrate 216 without exposing the sidewalls of the wafer 200. Instead, the dicing is performed so as to leave a portion of the encapsulant remain on the wafer sidewalls that defined the scribe channels 216 in FIG. 2C. Thus, a first portion of the wafer 200 remains covered by encapsulant. Here, the first portion includes the top and sides of the wafer. The remaining (second) portion of the wafer is covered by a part of the carrier substrate that remains after dicing.

Therefore, advantageously, no adhesive is needed to bond the semiconductor substrates 204a, 204b to the carrier substrate 210.

Note that, in embodiments that include the optional layer 212, the layer 212 is not necessarily formed on the wafer bonding surface 202 or on the carrier substrate 210. In the case where the layer 212 is not formed, such as with the wafer substrate 202 or the carrier substrate 210.

Figure 3:
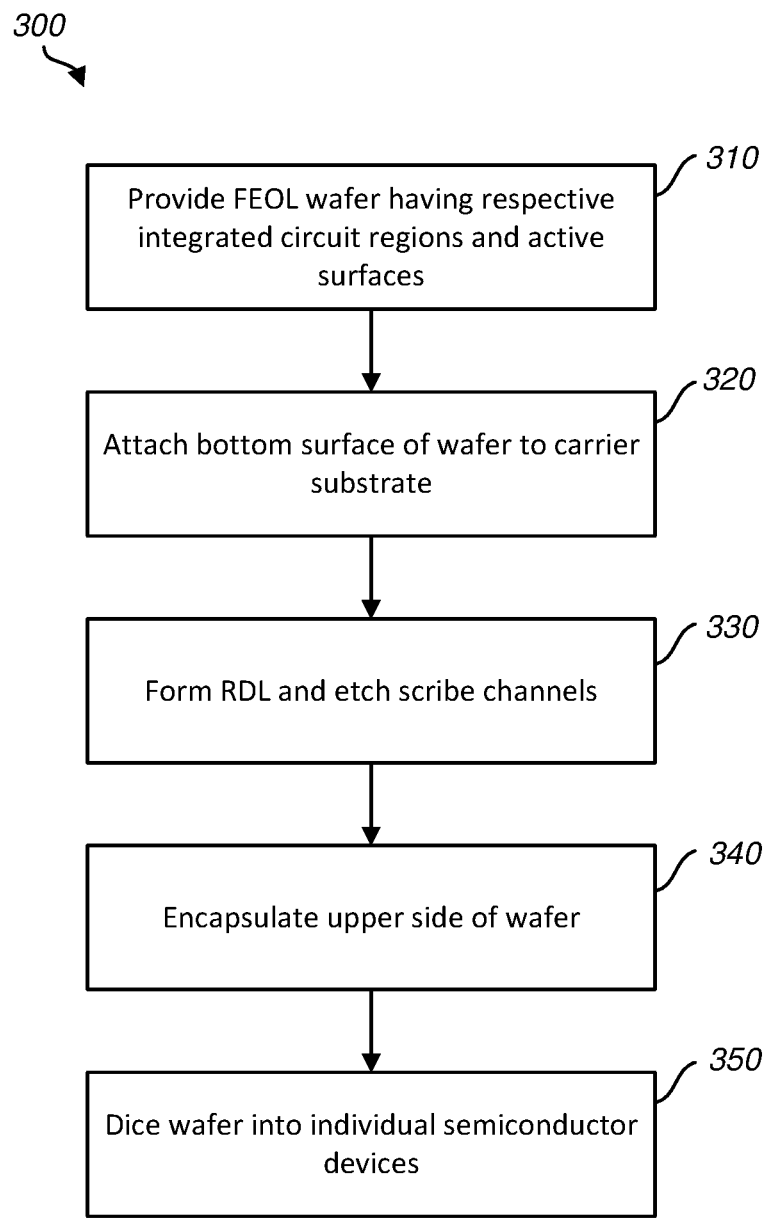
FIG. 3 shows a plan view of an embodiment of a framing member according to an embodiment of the present disclosure.

FIG. 3 is a process flow diagram 300 showing an exemplary method for fabricating a wafer level package according to the present disclosure. In this embodiment, the method of manufacturing a semiconductor device starts with a step 310 of providing an FEOL wafer having an active surface and an integrated circuit region. Next, at step 320, the wafer is attached to a carrier substrate, preferably formed of copper or other material having high heat conductivity.

Step 310 can include forming a bonding surface on the bottom surface of the wafer 200 and on the upper surface of the carrier substrate 210. More specifically, a wafer bonding surface 202 is formed on the wafer 200 and a carrier bonding surface 208 is formed on the carrier substrate 210. Formation of the wafer bonding surface 202 and the carrier bonding surface 208 can include planarizing the surfaces, for example by chemical mechanical polishing (CMP) or the like. In some embodiments, the planarizing of the wafer bonding surface 202 and the carrier bonding surface 208 results in a surface average roughness Ra of less than or equal to 20 Angstroms (Å), or more preferably less than or equal to 15 Angstroms (Å), or even more preferably less than or equal to 10 Angstroms (Å).

In some embodiments, the polished carrier bonding surface 208 can be passivated with corrosion inhibitor to prevent oxidation.

Alternatively, in some embodiments a thin layer 212 of metal, for example titanium, tantalum, or copper is sputtered on the wafer bonding surface 202 and on the carrier bonding surface 208. The layers 212 are preferably less than 1 nm in thickness.

The smooth wafer and carrier bonding surfaces can be bonded together by proximity contact with bonding force in a range of 0 g/mm2 to 100 g/mm2, thereby bonding the carrier substrate 210 to the wafer 200. Copper surfaces, particularly when formed as a film, can undergo a "self-annealing" process resulting in ionic bonding with an adjoining surface, even at room temperature.

Alternatively, since the self-annealing process can sometimes yield non-uniformities, annealing can instead occur at an elevated temperature. In some embodiments, the annealing is done at a temperature in a range of 15 C to 250 C, or more preferably in a range of 100 C to 220 C, or even more preferably in a range of 150 C to 200 C. Annealing at an elevated temperature in the foregoing ranges can provide progressively higher bonding toughness (J/m2).

Next, at step 330, the wafer 200 has undergone at least a portion of back-end-of-line (BELL) processes, including formation of the RUL layer 214 and etching of scribe-channels ("streets") 216. The REM layer 214 re-routes the I/O layout into a looser pitch footprint. Such redistribution typically includes thin film polymers such as BCB, PI or other organic polymers and metallization such as Al or Cu to reroute the peripheral pads to an area array configuration. Step 330 can also include forming solder balls 218 on the RIX, 214 for further connection of signals to and from the wafer 200.

In some embodiments, step 330 can further include wafer testing to check for proper functionality. This testing can include fab tests on the wafer 200 prior to dicing. In some embodiments a fab can test the integrated circuit son the wafer 200 with an electronic tester that presses tiny probes against the integrated circuit and marks bad circuits, usually with a drop of dye. The machine marks each bad integrated circuit with a drop of dye. The resulting binning data can be used to trace manufacturing defects and mark bad chips. This map can also be used during wafer assembly and packaging.

Testing times vary from a few milliseconds to a couple of seconds, and the test software is optimized for reduced testing time. Multiple chip (multi-site) testing is also possible, because many testers have the resources to perform most or all of the tests in parallel.

Chips are often designed with "testability features" such as scan chains or a "built-in self-test" to speed testing, and reduce testing costs. In certain designs that use specialized analog fab processes, wafers can also laser-trimmed during the testing, in order to achieve tightly-distributed resistance values as specified by the design.

Next, at step 340, once the wafer has been tested, the water can be reduced in thickness in a process also known as "backlap," "backfinish," or "wafer thinning" before the wafer is covered with an encapsulation layer 220.

Finally, at step 350, the wafer is scored and then broken into individual dice, each with a respective one of the integrated circuits from the wafer, in a process known as wafer dicing. Only the good, unmarked chips are packaged.

Those skilled in the art will readily observe that numerous modifications and alterations of the device and method may be made while retaining the teachings of the invention. Accordingly, the above, disclosure should be construed as limited only by the metes and bounds of the appended claims.

What is claimed is:

1. A method of manufacturing a semiconductor device, comprising:
   providing a wafer having a plurality of integrated circuits;
   securing a lower surface of the wafer to a supporting surface of a carrier substrate;
   forming a redistribution layer (RDL) on an upper surface of the wafer, the upper surface of the wafer being opposite the lower surface of the wafer;
   etching scribe channels through the RDL and at least a portion of the wafer towards the carrier substrate in the wafer from the RDL to the carrier substrate;
   encapsulating the wafer and RDL within an encapsulant, including providing a portion of the encapsulant in the scribe channels; and
   dicing the wafer and carrier substrate along the scribe channels without exposing the wafer such that the wafer remains covered on a first portion thereof by the carrier substrate and a remaining portion thereof by the encapsulant,
   wherein the securing of the lower surface of the wafer to the supporting surface of the carrier substrate includes coating the supporting surface of the carrier substrate with a corrosion inhibitor.

2. The method of claim 1, wherein the plurality of integrated circuits includes at least two identical integrated circuits.

3. The method of claim 1, wherein the securing of the lower surface of the wafer to the supporting surface of the carrier substrate includes forming a bonding surface on at least one of the carrier substrate and the wafer.

4. The method of claim 3, wherein the forming of the bonding surface includes planarizing to achieve the bonding surface having a roughness of less than or equal to 20 Angstroms.

5. The method of claim 1, wherein the securing of the lower surface of the wafer to the supporting surface of the carrier substrate further includes bonding the lower surface of the wafer to the supporting surface of the carrier substrate by proximity contact.

6. The method of claim 5, wherein the proximity contact is made with a bonding force that is less than or equal to 100 g/mm2.

7. The method of claim 1, wherein the securing of the lower surface of the wafer to the supporting surface of the carrier substrate includes a self-annealing process performed at a designated temperature.

8. The method of claim 7, wherein the self-annealing process is performed at a temperature in a range of 15° C. to 250° C.

9. The method of claim 1, wherein the first portion of the wafer that remains covered by the carrier substrate is the lower surface of the wafer.

10. The method of claim 1, wherein a remaining portion of the wafer that remains covered by the carrier substrate includes the upper surface and side surfaces of the wafer.

11. A method of manufacturing a semiconductor device, comprising:
    providing a wafer having a plurality of integrated circuits;
    securing a lower surface of the wafer to a supporting surface of a carrier substrate;
    forming a redistribution layer (RDL) on an upper surface of the wafer, the upper surface of the wafer being opposite the lower surface of the wafer;
    etching scribe channels through the RDL and at least a portion of the wafer towards the carrier substrate in the wafer from the RDL to the carrier substrate;

encapsulating the wafer and RDL within an encapsulant, including providing a portion of the encapsulant in the scribe channels; and dicing the wafer and carrier substrate along the scribe channels without exposing the wafer such that the wafer remains covered on a first portion thereof by the carrier substrate and a remaining portion thereof by the encapsulant, wherein the securing of the lower surface of the wafer to the supporting surface of the carrier substrate includes coating at least one of the lower surface and the supporting surface with a metal layer; and wherein the metal layer includes at least one of titanium, tantalum, and copper.

12. The method of claim 11, wherein the metal layer is less than or equal to 1 nm in thickness.

13. The method of claim 11, wherein the securing of the lower surface of the wafer to the supporting surface of the carrier substrate further includes bonding the lower surface of the wafer to the supporting surface of the carrier substrate by proximity contact.

14. The method of claim 13, wherein the proximity contact is made with a bonding force that is less than or equal to 100 g/mm2.

15. A method of manufacturing a semiconductor device, comprising:

providing a wafer having a plurality of integrated circuits;

securing a lower surface of the wafer to a supporting surface of a carrier substrate;

forming a redistribution layer (RDL) on an upper surface of the wafer, the upper surface of the wafer being opposite the lower surface of the wafer;

etching scribe channels through the RDL and at least a portion of the wafer towards the carrier substrate in the wafer from the RDL to the carrier substrate;

encapsulating the wafer and RDL within an encapsulant, including providing a portion of the encapsulant in the scribe channels; and dicing the wafer and carrier substrate along the scribe channels without exposing the wafer such that the wafer remains covered on a first portion thereof by the carrier substrate and a remaining portion thereof by the encapsulant, wherein the securing of the lower surface of the wafer to the supporting surface of the carrier substrate includes a self-annealing process resulting bonding between the lower surface of the wafer and the supporting surface of the carrier substrate.

16. The method of claim 15, wherein the self-annealing process results in ionic bonding between the lower surface of the wafer and the supporting surface of the carrier substrate.

17. The method of claim 15, wherein the self-annealing process is performed at a temperature in a range of 15° C. to 27° C.

* * * * *